United States Patent [19]

Mommsen

[11] Patent Number: 4,682,735

[45] Date of Patent: Jul. 28, 1987

[54] ELECTROSTATIC FIELD INDICATOR LIGHT FOR ELECTROSTATIC NOZZLES

[75] Inventor: Gordon V. Mommsen, Brooklyn Center, Minn.

[73] Assignee: Graco Inc., Minneapolis, Minn.

[21] Appl. No.: 508,887

[22] Filed: Jun. 29, 1983

[51] Int. Cl.⁴ .......................... G01R 29/12; B05B 5/02
[52] U.S. Cl. ..................................... 239/690; 324/72; 239/71; 239/691
[58] Field of Search ................. 239/690, 691, 289, 71; 324/72, 457; 340/600

[56] References Cited

U.S. PATENT DOCUMENTS

| | | | |
|---|---|---|---|
| 1,536,808 | 5/1925 | Norden | 324/395 |
| 2,552,678 | 5/1951 | Hirbee | 324/72 X |
| 3,260,616 | 7/1966 | Brewer | 324/453 X |
| 4,084,134 | 4/1978 | Nogano | 324/133 |
| 4,349,783 | 9/1982 | Robson et al. | 324/457 |
| 4,370,616 | 1/1983 | Williams | 324/457 X |
| 4,433,296 | 2/1984 | Kolibas | 324/133 X |
| 4,586,657 | 5/1986 | Johnson et al. | 239/691 |

*Primary Examiner*—Andres Kashnikow
*Assistant Examiner*—Kevin Patrick Weldon
*Attorney, Agent, or Firm*—Paul L. Sjoquist

[57] ABSTRACT

An indicator light apparatus having two terminals, one of the terminals being connected to the common or ground circuit of an electrostatic spray gun, preferably by connection to a grounded spray gun handle, the other terminal being placed in the proximity of the electrostatic field generated by the spray gun, so as to collect voltage charges emitted from the high voltage electrode of the spray gun and to conduct these charges to ground through the light indicator, which is typically a neon light or the like. The presence of electrostatic high voltage causes sufficient current flow through a light indicator to illuminate the light and provide an indication that the high voltage circuits are operating properly.

13 Claims, 2 Drawing Figures

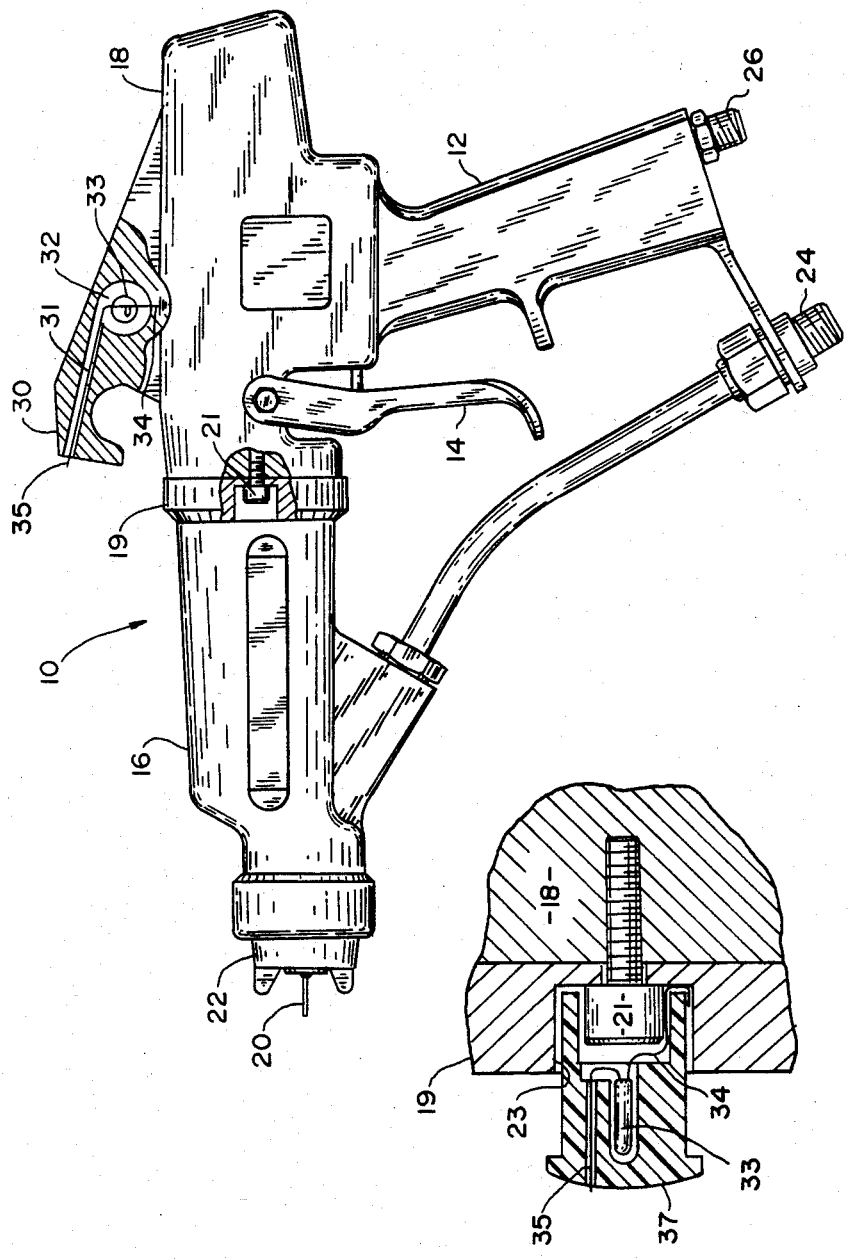

ELECTROSTATIC FIELD INDICATOR LIGHT FOR ELECTROSTATIC NOZZLES

BACKGROUND OF THE INVENTION

The present invention relates to electrostatic spray guns, and more particularly to an apparatus for indicating when such spray guns are operating effectively.

Electrostatic spray guns have been used for many years in the field of spray painting and spraying and atomizing other types of charged particles for depositing upon conductive articles. In the field of spray painting it has become more or less conventional to place the article to be coated at an electrical ground voltage potentional, and to develop an electrostatic field by means of an electrode placed in the proximity of the spray gun itself, the field being developed between the electrode and the grounded article. Further, it has become generally acceptable in the industry that the best electrostatic spraying efficiencies are obtained when the charging electrode on the spray gun itself is in reasonably close proximity to the discharge orifice where particles are emitted from the spray gun. Such electrodes usually take the form of sharply pointed needles or edges, with the understanding that the elctrostatic field generated from a point of sharp discontinuity creates the highest electrostatic field intensity in the region of the sharp discontinuity. When this discontinuity is placed in the region near the paint orifice, the emitted paint particles are then subject to the maximum electrostatic field intensity, and the paint particles are most effectively voltage charged. Electrostatic paint spraying is usually accomplished in combination with other forms of paint atomization, as for example, atomization by means of impinging air jets upon an emitted column of paint, or hydraulic atomization wherein high hydraulic paint pressures force the liquid paint through a very constricted orifice. In these cases the electrostatic field developed between a point electrode and a grounded article causes the atomized paint droplets to become voltage charged, and thereby enhances the attractive forces developed between the paint droplets and the grounded article to be coated.

Since the electrostatic field developed between a spray gun and a grounded article is invisible, it is sometimes difficult to determine whether and to what extend the electrostatic field is contributing to painting efficiency. Of course, the electrostatic field developed at a spray gun can be detected by an operator in bringing the electrodes in close proximity to his body, but this is not only discomforting, it can also be hazardous. An experienced operator can detect when an electrostatic voltage potential has disappeared or diminished by observing the quality of coating on the article itself, but this is difficult to detect and may result in a number of articles being inefficiently coated before the operator notices a change in coating efficiency. An inexperienced operator may very well not realize any change in coating efficiency as a result of a drop or loss of electrostatic voltage and could very well operate an electrostatic spray gun for a long period of time without realizing that the electrostatic voltage is not being generated by the gun.

Automatic electrostatic paint spraying systems are gaining wider acceptance in the industry, wherein a plurality of electrostatic spray guns are mounted on a fixed or movable frame assembly, alongside a moving conveyor line upon which articles are mounted. These spray guns are frequently mounted inside of large spray painting booths, and a plurality of such guns may be monitored by a single operator. If electrosatic voltage fails on any one of these spray guns it may be difficult or impossible for an operator to detect any change in the overall operation of the system, where the performance of a single spray gun is difficult to evaluate in a context of a large system of a number of guns operating simultaneously. Voltage indicators have been incorporated into high voltage power supplies for the purpose of providing such a monitoring mechanism, but such indicators only provide a verification that high voltage is being developed at the power supply. If a break in the voltage circuit between the power supply and the electrode occurs, it may be very difficult for the operator to detect that system performance is degraded.

Therefore there is a need to provide a simple and effective indicating mechanism which provides an indication of the operating effectiveness of a high voltage circuit in a spray gun. Further, there is a need to provide such a mechanism which is responsive to the electrostatic field generated at the electrode itself, rather than being responsive to other circuits which do not include the entire voltage path contained in a high voltage circuit.

SUMMARY OF THE INVENTION

The present invention includes a high voltage indicating light mounted proximate an electrostatic paint spray gun, wherein one terminal of the light is electrically grounded to the spray gun itself, and a second terminal is placed in proximity to the electrostatic field generated by the gun. The second terminal collects voltage charges emitted by the spray gun electrodes in sufficient quantities to illuminate the light contained therein. A preferred form of light indicating mechanism for the invention has been found to be a small neon bulb, although other types and forms of illuminating devices may be suitable for this purpose.

It is therefore a principal object of the present invention to provide a visual indicating means for detecting the presence of high voltage being generated by an electrostatic spray gun, and for providing visual indication of the presence of such voltage.

It is a further object of the present invention to provide a light indicating device which is extremely simple and economical to adapt to spray guns.

A further object of the present invention is to provide a plurality of indicating lights, thereby assuring the redundancy of light indicating means for enabling replacement of indicating lights which fail.

BRIEF DESCRIPTION OF THE DRAWINGS

A complete understanding of the invention will be achieved from the following specification and claims, and with reference to the appended drawings in which:

FIG. 1 shows an electrostatic spray gun in elevation view, and in partial cross section, having the invention incorporated therein; and FIG. 2 shows an alternative embodiment of the invention.

DESCRIPTION OF THE PREFERRED EMBODIMENT

Referring to FIG. 1, there is shown an electrostatic spray gun 10 which is representative of the types of spray guns which are intended for use with the present invention. Electrostatic spray gun 10 is the type generally referred to as a manual spray gun, in that is has a handle 12 and a trigger 14 adapted for handling by an operator. By contrast, other types of spray guns which are equally adaptable to the present invention are known as automatic spray guns, such guns being characterized in that they are adapted for mechanical connection to a fixed or movable frame assembly, and are actuable by automatic means, not requiring the handling of an operator. Automatic guns are to be understood to be equally applicable for use in connection with the present invention.

Spray gun 10 has a projecting barrel 16, and a body 18 which interconnects barrel 16 with handle 12. Barrel 16 is preferably made from an insulative or nonconductive material, and handle 12 is made from a conductive material. Handle 12 is preferably electrically connected to ground potential, by means of suitable cable or other electrical connections. Body 18 may be made from either conductive or nonconductive material, depending upon the particular spray gun design, but in any event it is to be understood that electrical connections exist within spray gun 10 to provide the necessary grounding referred to herein.

Spray gun 10 has a projecting needle electrode 20 which projects forwardly in the proximity of a nozzle 22. Atomized paint spray droplets are emitted from nozzle 22, and accumulate electrical charges from electrode 20. The liquid paint may be coupled to spray gun 10 by means of a paint connector 24, and an external power source such as air or high voltage may be provided through a connector 26. Electrostatic high voltage may be developed internally of spray gun 10, as is the case with some spray gun models, or it may be developed externally and connected to spray gun 10 by means of a suitable cable and connection at connector 26. In either case, the high votage termination point is an electrode 20 placed proximate the atomization orifice in nozzle 22, for the purposes described herein.

A manual spray gun typically has a bracket 30 extending from body 18. Bracket 30 is usually curved or hooked, and serves as a hanging bracket for storing the gun when not in use. In the preferred embodiment of this invention, it is presumed that bracket 30 is constructed from nonconductive material, although it will be clear to those skilled in the art that the essential teachings of the invention can be provided with a conductive bracket, by suitable insulation of the electrical connection recited herein. Bracket 30 has a forwardly projecting passage 31, which opens rearwardly into a recess 32. Recess 32 is preferably a hole drilled completely through bracket 30 for purposes to be hereinafter described. An indicating light 33 is mounted in recess 32, and is preferably of the neon bulb variety commonly and commercially available. One type of neon indicator light which has been found suitable for use with the present invention is neon bulb type NE-1H, manufactured by Alco Electronic Products, Inc., North Andover, Mass. This neon indicator light has a DC ignition potential of sixty-seven volts, which has bee found to give good results in the present application. Light 32 has a first terminal 34 which is connected to electrical ground potential, according to specific procedures which will depend upon the overall design of the spray gun itself. Light 33 has a second terminal 35 which is brought out through passage 31 to the forward end of passage 31. Terminal 35 may project slightly forward of bracket 30, or it may simply be made flush with the front surface of bracket 30. As constructed, light 33 has one terminal connected to an electrical ground potential, and a second terminal which is floating in potential, but which is in the region of electrostatic voltage intensity developed by electrode 20.

FIG. 2 shows an alternative embodiment wherein the invention is placed at a different position on the spray gun 10. In this embodiment, the invention is electrically connected to a lock screw 21 which holds clamping ring 19 against body 18. Locking screw 21 is electrically grounded, either by virtue of body 18 being at ground potential, or by other suitable electrical connection to ground potential. Locking screw 21 is seated into a recess 23 in clamping ring 19, and a transparent plastic cap 37 is sized to tightly grip and clamp over the outside surface of screw 21. Plastic cap 37 has a recess therein for seating light 33, and has a forwardly directed passage for feeding terminal 35 to the front surface of cap 37. Terminal 34 is directed along the inside surface of cap 37 and looped about its bottom edge, so as to become tightly clamped against screw 21, and thereby to form an electrical ground connection. Terminal 35 serves as a forwardly projecting antenna, having at least a conductive tip projecting into the region of electrostatic field potential.

In operation, whenever trigger 14 is depressed the spray gun is actuated for the delivery of paint and paint atomization forces, and including the development of a high voltage at electrode 20. The voltage at electrode 20 develops a very intensive electrostatic field in the region proximate the nozzle 22, which field is developed between electrode 20 and a grounded conveyor or other article holding mechanism. Although the electrostatic field is primarily developed as described, in all practical spray gun designs there is also a secondary electrostatic field developed between electrode 20 and the grounded portion of the spray gun. In the case of the example of FIG. 1, there is a secondary electrostatic field developed between electrode 20, handle 12 and body 18 if it is made of conductive material. The presence of this secondary electrostatic field is detected by terminal 35 which is connected to light 33. Terminal 35 collects voltage charges from this field and conducts them to light 33 and subsequently to ground. A sufficient voltage intensity is developed within light 33 to ionize the neon or other gaseous medium therein, thereby causing illumination. In the embodiment of FIG. 2 the same principles are applied to develop illumination of the light enclosed by cap 37. In this case, since there are usually at least two lock screws 21 adapted to hold clamping ring 19 against body 18, it is possible to utilize two lamps suitably mounted to each of these screws. This provides a redundant lamp circuit, and enables an operator to replace a burned out light while still having the benefit of the redundant light for indicating the presence of an electrostatic field. The amount of light intensity generated by this illumination is to some extent dependent upon the amount of current provided therethrough, and therefore the degree of light intensity emitted by light 33 is representative of the magnitude of the electrostatic field generated by electrode 20. In this respect, light 33 not only serves as an indicator of the presence of an electrostatic field, but its intensity provides an indication of the magnitude of the electrostatic field as well. There is provided thereby a visual indication of both the presence of and quality of an electrosatic field generated by the electrostatic spray gun.

It is preferable that a light source of the voltage breakdown type be used in this invention, for such devices are bilevel operating devices in that illumination is caused by voltage breakdown through a gaseous medium. The gaseous medium is preferably neon, although other types of gaseous medium may be suitable for operation with the invention. A particular advantage with this type of device is that illumination is created at a predetermined voltage breakdown potential and is self-sustaining at a predetermined lower operating voltage, producing ample illumination for visual inspection. The amount of light produced is relatively constant while the voltage breakdown persists, at least at a minimum light intensity level, while at the same time the light intensity may increase from this minimum level if higher currents are caused to flow through the circuit. This produces a non-linear lighting effect, producing visible light in the presence of an electrostatic field and increasing the intensity of that visible light in stronger electrostatic fields.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A light indicator apparatus for attachment to a high voltage electrostatic field generating device, comprising a two-terminal voltage breakdown gaseous light indicating means for generating light illumination in response to a predetermined voltage applied to one of said terminals, said light indicating means being attached to said device, one of said terminals being connected to the common voltage return path of said electrostatic field generating device, and the other of said terminals being unconnected, but having an end of said terminal physically positioned in the region of said high voltage electrostatic field.

2. A light indicating apparatus for indicating the presence of an electrostatic voltage field in association with an electrostatic spray gun having a grounded body, comprising a voltage breakdown gaseous light bulb attached to said spray gun, said bulb having two electrical input terminals; one of said terminals connected to said spray gun electrically grounded body; the other of said terminals projecting into the physical region of said electrostatic voltage field.

3. The apparatus of claim 2, wherein said light bulb further comprises a neon light bulb.

4. The apparatus of claim 3, further comprising a translucent cap having an interior opening sized to receive said bulb, said cap having a passage therethrough adapted for insertion of said other terminal.

5. The apparatus of claim 4, wherein said spray gun further comprises at least one fastener connected to an electrical ground and having a projecting head, and said cap is sized for press-fitting over said projecting head.

6. The apparatus of claim 5, wherein said one terminal of said bulb is clamped between said cap and said projecting head.

7. A light indicator for attachment to an electrically grounded electrostatic spray gun, comprising
   (a) a gaseous filled bulb device having two electrodes therein, each electrode connected to an externally projecting wire, said device having the characteristic of producing visible illumination upon the application of a predetermined voltage across said projecting wire;
   (b) one of said projecting wires being connected to said spray gun electrical ground;
   (c) the other of said projecting wires being positioned in the electrostatic field produced by said electrostatic spray gun.

8. The apparatus of claim 7, further comprising a translucent cap about said bulb, said cap attaching said bulb to said spray gun.

9. The apparatus of claim 8, wherein said spray gun further comprises a projecting electrically grounded port and said cap is adapted for clamping against said port, and one of said projecting wires is clamped between said cap and said port.

10. The apparatus of claim 9, wherein said cap further comprises a passage therethrough and said other projecting wire is positioned in said passage.

11. In combination, an electrostatic spray gun having a forwardly projecting high voltage electrode, means for delivering a high voltage to said electrode through the grounded body of said spray gun, and a gas-filled bulb having spaced apart electrodes therein, said bulb exhibiting voltage breakdown characteristics upon application of sufficient voltage between said spaced apart electrodes and said gas emitting visible light under said voltage breakdown conditions, and a conductor attached to each of said spaced apart electrodes and passing outside said bulb, one of said conductors being attached to said grounded body of said spray gun and the other conductor being unconnected and in the presence of the electrostatic field generated by said spray gun high voltage electrode.

12. The apparatus of claim 11, further comprising a translucent cap fitted over said bulb, said cap having a passage therethrough for accepting said unconnected conductor.

13. The apparatus of claim 12, wherein said cap further comprises means for electrically connecting said one conductor to said grounded body of said spray gun.

* * * * *